(12) United States Patent
Lee et al.

(10) Patent No.: US 8,933,723 B2
(45) Date of Patent: Jan. 13, 2015

(54) TERMINATING RESISTANCE GENERATION DEVICE FOR DIFFERENTIAL INPUT MODE COMMUNICATION AND DIFFERENTIAL INPUT MODE COMMUNICATION DEVICE

(71) Applicant: LG Chem, Ltd., Seoul (KR)

(72) Inventors: Hyunchul Lee, Daejeon (KR); Jin Seok Heo, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/361,340

(22) PCT Filed: Oct. 24, 2013

(86) PCT No.: PCT/KR2013/009536
§ 371 (c)(1),
(2) Date: May 29, 2014

(87) PCT Pub. No.: WO2014/069839
PCT Pub. Date: May 8, 2014

(65) Prior Publication Data
US 2014/0312927 A1 Oct. 23, 2014

(30) Foreign Application Priority Data
Oct. 29, 2012 (KR) .................. 10-2012-0120270

(51) Int. Cl.
*H03K 17/16* (2006.01)
*H03K 19/003* (2006.01)
*H03K 19/00* (2006.01)

(52) U.S. Cl.
CPC .................. *H03K 19/0005* (2013.01)
USPC ............................. 326/30; 326/86

(58) Field of Classification Search
None
See application file for complete search history.

(56) References Cited

U.S. PATENT DOCUMENTS 5,977,796 A * 11/1999 Gabara ..................... 326/86
6,586,964 B1 * 7/2003 Kent et al. ................. 326/30
(Continued)

FOREIGN PATENT DOCUMENTS

KR 10-2005-0064897 A 6/2005
KR 10-0652391 B1 12/2006
(Continued)

OTHER PUBLICATIONS

International Search Report issued in PCT/KR2013/009536, mailed on Feb. 7, 2014.
(Continued)

*Primary Examiner* — Crystal L Hammond
(74) *Attorney, Agent, or Firm* — Birch, Stewart, Kolasch & Birch, LLP

(57) ABSTRACT

Disclosed are a terminating resistance generation device for differential input mode communication and a differential input mode communication device. The terminating resistance generation device for differential input mode communication according to the present invention includes: a first circuit unit including a first ground terminal and operating only when the first ground terminal is connected to a ground; a second circuit unit including a second ground terminal and operating only when the second ground terminal is connected to the ground; and a terminating resistance generating unit generating terminating resistance when one of the first ground terminal and the second ground terminal is not connected, and as a result, only one of the first circuit unit and the second circuit unit operates.

16 Claims, 4 Drawing Sheets

(56) References Cited

U.S. PATENT DOCUMENTS

| | | | | |
|---|---|---|---|---|
| 6,963,219 | B1 * | 11/2005 | Ghia et al. | 326/30 |
| 7,808,269 | B2 * | 10/2010 | Matsudera | 326/30 |
| 7,917,042 | B2 * | 3/2011 | Adamiecki et al. | 398/202 |
| 8,008,944 | B2 * | 8/2011 | Dixit et al. | 326/30 |
| 8,030,961 | B2 * | 10/2011 | Matsudera | 326/30 |
| 8,653,853 | B1 * | 2/2014 | Shumarayev et al. | 326/82 |
| 2006/0132179 | A1 | 6/2006 | Kim | |
| 2011/0267022 | A1 | 11/2011 | Hong et al. | |

FOREIGN PATENT DOCUMENTS

| | | |
|---|---|---|
| KR | 10-2008-0001805 A | 1/2008 |
| KR | 10-2010-0077750 A | 7/2010 |
| KR | 10-0980626 B1 | 9/2010 |

OTHER PUBLICATIONS

Written Opinion issued in PCT/KR2013/009536, mailed on Feb. 7, 2014.

* cited by examiner

US 8,933,723 B2

TERMINATING RESISTANCE GENERATION DEVICE FOR DIFFERENTIAL INPUT MODE COMMUNICATION AND DIFFERENTIAL INPUT MODE COMMUNICATION DEVICE

CROSS-REFERENCE TO RELATED APPLICATIONS

This application claims priority to and the benefit of Korean Patent Application No. 10-2012-0120270 filed in the Korean Intellectual Property Office on Oct. 29, 2012, the entire contents of which are incorporated herein by reference.

TECHNICAL FIELD

The present invention relates to a terminating resistance generation device for differential input mode communication and a differential input mode communication device, and more particularly, to a terminating resistance generation device for differential input mode communication and a differential input mode communication device that use a plurality of same communication boards in a differential input mode communication device, in which when the communication board is positioned at a termination, terminating resistance is generated and when the communication board is not positioned at the termination, the terminating resistance is not generated, so that the differential input mode communication device needs not manage the communication board so as to distinguish whether the communication board is positioned at the termination and it is possible to prevent a mistake in which the terminating resistance is removed from the communication board positioned at the termination at the time of installing the communication device and since the same communication board is used regardless of the position of the communication board, maintenance and management is convenient.

BACKGROUND ART

In the case of differential input mode serial communication such as controller area network (CAN) communication, recommended standard (RS)-485 communication, recommended standard (RS)-422 communication, or the like, a terminating resistance needs to be installed at a termination of a communication device.

FIG. 1 is a diagram illustrating a differential input mode communication device in the related art. Since the communication device has impedance according to various design references in the differential input mode communication, a reflection phenomenon occurs at the termination of the communication device.

As a result, resistances 12 and 13 are connected to both terminations of a line 11 of the communication device to circulate constant current throughout the line, to reduce the reflection phenomenon and be resistant to noise by adjusting impedance on the line 11. In this case, installed resistances are terminating resistances 12 and 13.

FIGS. 2 and 3 are diagrams illustrating examples of installing terminating resistances in the differential input mode communication device in the related art.

In the differential input mode communication device in the related art, terminating resistances are inserted by using a method of installing terminating resistances 23 and 24 on communication boards 21 and 22 positioned at terminations as illustrated in FIG. 2 or installing terminating resistances 35 and 36 on outer communication connectors 33 and 34 of communication boards 31 and 32 positioned at terminations as illustrated in FIG. 3.

However, since the differential input mode communication device in the related art needs to manage the communication board so as to distinguish whether the communication board is positioned at the termination, it is inconvenient to maintain and manage the communication device and when the communication device is first installed, a mistake in which the terminating resistance is removed from the communication board positioned at the termination may occur.

SUMMARY OF THE INVENTION

The present invention has been made in an effort to provide a terminating resistance generation device for differential input mode communication and a differential input mode communication device that use a plurality of same communication boards in a differential input mode communication device, in which when the communication board is positioned at a termination, terminating resistance is generated and when the communication board is not positioned at the termination, the terminating resistance is not generated, so that the differential input mode communication device needs not manage the communication board so as to distinguish whether the communication board is positioned at the termination and it is possible to prevent a mistake in which the terminating resistance is removed from the communication board positioned at the termination at the time of installing the communication device and since the same communication board is used regardless of the position of the communication board, maintenance and management is convenient.

An exemplary embodiment of the present invention provides a terminating resistance generation device for differential input mode communication, including: a first circuit unit including a first ground terminal and operating only when the first ground terminal is connected to a ground; a second circuit unit including a second ground terminal and operating only when the second ground terminal is connected to the ground; and a terminating resistance generating unit generating terminating resistance when one of the first ground terminal and the second ground terminal is not connected, and as a result, only one of the first circuit unit and the second circuit unit operates.

The first circuit unit may include one or more transistors that are turned on to operate only when the first ground terminal is connected to the ground.

The second circuit unit may include one or more transistors that are turned on to operate only when the second ground terminal is connected to the ground.

The terminating resistance generating unit may include a plurality of resistances and a switching element among the plurality of resistances.

The terminating resistance generating unit may not generate the terminating resistance because the switching element is turned off, and as a result, the plurality of resistances is not connected when both the first circuit unit and the second circuit unit operate.

The terminating resistance generating unit may generate the terminating resistance because the switching element is turned on, and as a result, the plurality of resistances are connected to each other when only one of the first circuit unit and the second circuit unit operates.

The switching element may be an N-channel depletion type MOSFET.

Another exemplary embodiment of the present invention provides a differential input mode communication, including:

a plurality of communication boards performing differential input mode communication, and the communication board may include a terminating resistance generation device that generates terminating resistance depending on whether the communication board is positioned at a termination. In this case, the terminating resistance generation device may include a first circuit unit including a first ground terminal and operating only when the first ground terminal is connected to a ground; a second circuit unit including a second ground terminal and operating only when the second ground terminal is connected to the ground; and a terminating resistance generating unit generating terminating resistance when one of the first ground terminal and the second ground terminal is not connected, and as a result, only one of the first circuit unit and the second circuit unit operates.

The terminating resistance may be generated at a communication board positioned at the termination among the plurality of communication boards, since one of the first ground terminal and the second ground terminal is not connected, and the terminating resistance may not be generated at a communication board not positioned at the termination among the plurality of communication boards, since both the first ground terminal and the second ground terminal are connected.

The first circuit unit may include one or more transistors that are turned on to operate only when the first ground terminal is connected to the ground.

The second circuit unit may include one or more transistors that are turned on to operate only when the second ground terminal is connected to the ground.

The terminating resistance generating unit may include a plurality of resistances and a switching element among the plurality of resistances.

The terminating resistance generating unit may not generate the terminating resistance because the switching element is turned off, and as a result, the plurality of resistances is not connected when both the first circuit unit and the second circuit unit operate.

The terminating resistance generating unit may generate the terminating resistance because the switching element is turned on, and as a result, the plurality of resistances are connected to each other when only one of the first circuit unit and the second circuit unit operates.

The switching element may be an N-channel depletion type MOSFET.

The differential input mode communication is one of controller area network (CAN) communication, recommended standard (RS)-485 communication, and recommended standard (RS)-422 communication.

According to an exemplary embodiment of the present invention, a terminating resistance generation device for differential input mode communication and a differential input mode communication device use a plurality of same communication boards are used, and when the communication board is positioned at a termination, terminating resistance is generated and when the communication board is not positioned at the termination, the terminating resistance is not generated, and the differential input mode communication device need not be managed distinguishing whether the communication board is positioned at the termination and it is possible to prevent a mistake in which the terminating resistance is removed from the communication board positioned at the termination at the time of installing the communication device and since the same communication board is used regardless of the position of the communication board, it is convenient to maintain and manage the terminating resistance generation device for differential input mode communication and the differential input mode communication device.

DETAILED DESCRIPTION

The present invention will be described below with reference to the accompanying drawings. Herein, the detailed description of a known function and configuration that may make the purpose of the present invention unnecessarily ambiguous in describing the spirit of the present invention will be omitted. Exemplary embodiments of the present invention are provided so that those skilled in the art may more completely understand the present invention. Accordingly, the shape, the size, etc., of elements in the figures may be exaggerated for explicit comprehension.

In the specification, unless explicitly described to the contrary, the word "comprise" and variations such as "comprises" or "comprising", will be understood to imply the inclusion of stated elements but not the exclusion of any other elements.

In addition, the terms "-unit" described in the specification mean units for processing at least one function and operation and can be implemented by hardware components or software components and combinations thereof.

Figure 4:
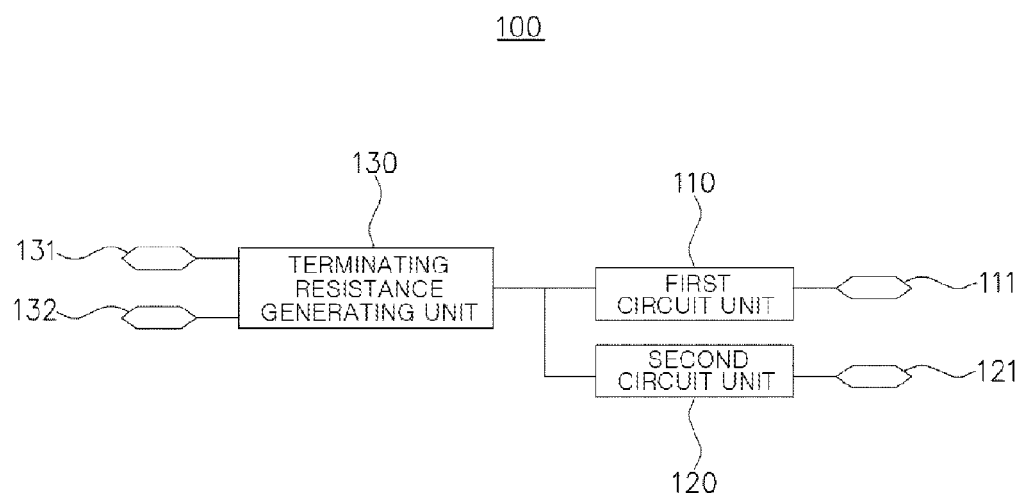
FIG. 4 is a diagram schematically illustrating a terminating resistance generation device for differential input mode communication according to an exemplary embodiment of the present invention.

FIG. 4 is a diagram schematically illustrating a terminating resistance generation device for differential input mode communication according to an exemplary embodiment of the present invention.

Figure 1:
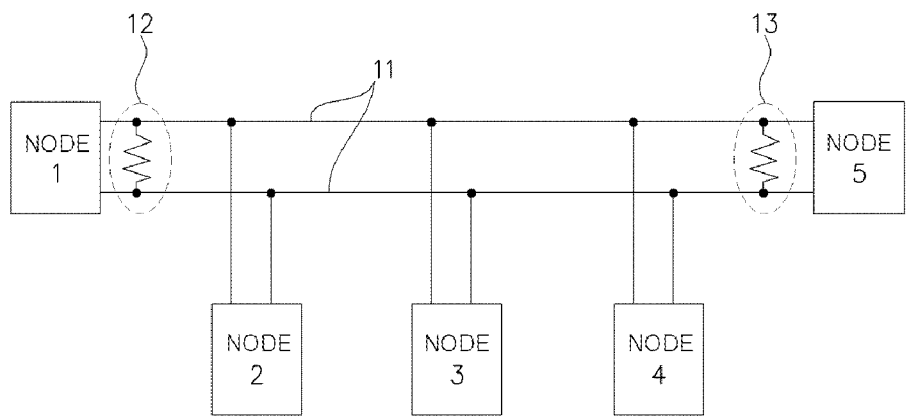
FIG. 1 is a diagram illustrating a differential input mode communication device in the related art.
Figure 2:
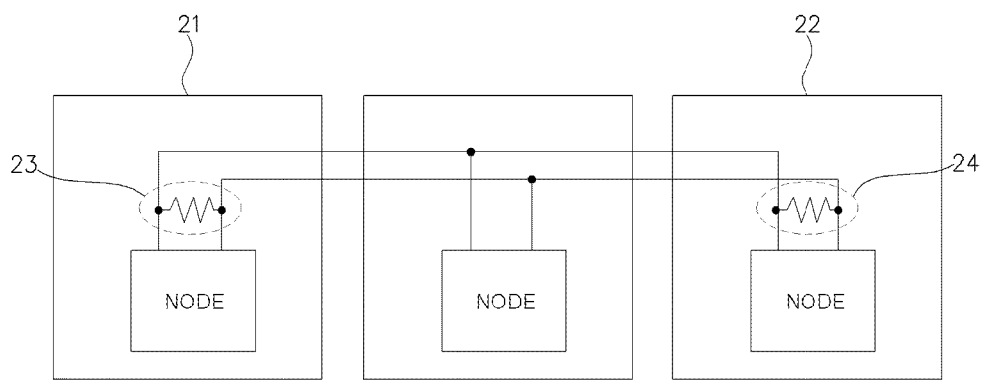
FIGS. 2 and 3 are diagrams illustrating examples of installing terminating resistances in the differential input mode communication device in the related art.
Figure 3:
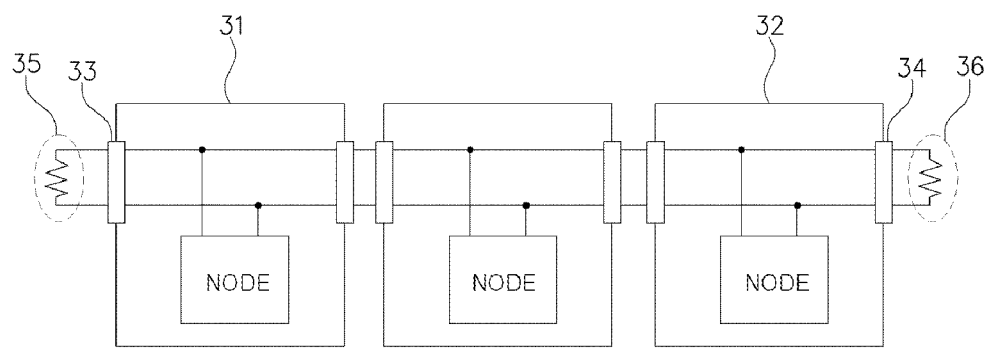

Referring to FIG. 4, a terminating resistance generation device 100 for differential input mode communication according to an exemplary embodiment of the present invention may be configured to include a first circuit unit 110, a second circuit unit 120, and a terminating resistance generating unit 130. The terminating resistance generation device 100 for differential input mode communication illustrated in FIG. 1 is the exemplary embodiment and the components thereof are not limited to the exemplary embodiment illustrated in FIG. 1 and some components may be added, changed, or deleted as necessary.

The terminating resistance generation device 100 for differential input mode communication according to the exemplary embodiment of the present invention may be implemented in a form in which the terminating resistance generation device 100 for differential input mode communication is included in a communication board of a differential input mode communication device and implemented in a form of the communication board.

The first circuit unit 110 includes a first ground terminal 111 and operates only when the first ground terminal 111 is connected to a ground. In addition, the second circuit unit 120 includes a second ground terminal 121 and operates only when the second ground terminal 121 is connected to the ground. Herein, the term 'operates' means that the corresponding circuit unit is turned on, and as a result, current flows on a circuit.

The terminating resistance generating unit 130 generates terminating resistance when one of the first ground terminal 111 and the second ground terminal 112 is not connected, and as a result, only one of the first circuit unit 110 and the second circuit unit 120 operates. The terminating resistance generating unit 130 may be configured to include a terminal 131 receiving a high signal of the differential input mode communication and a terminal 132 receiving a low signal of the differential input mode communication.

Hereinafter, one example of a detailed configuration of the terminating resistance generation device 100 for differential input mode communication will be described with reference to FIG. 5.

Figure 5:
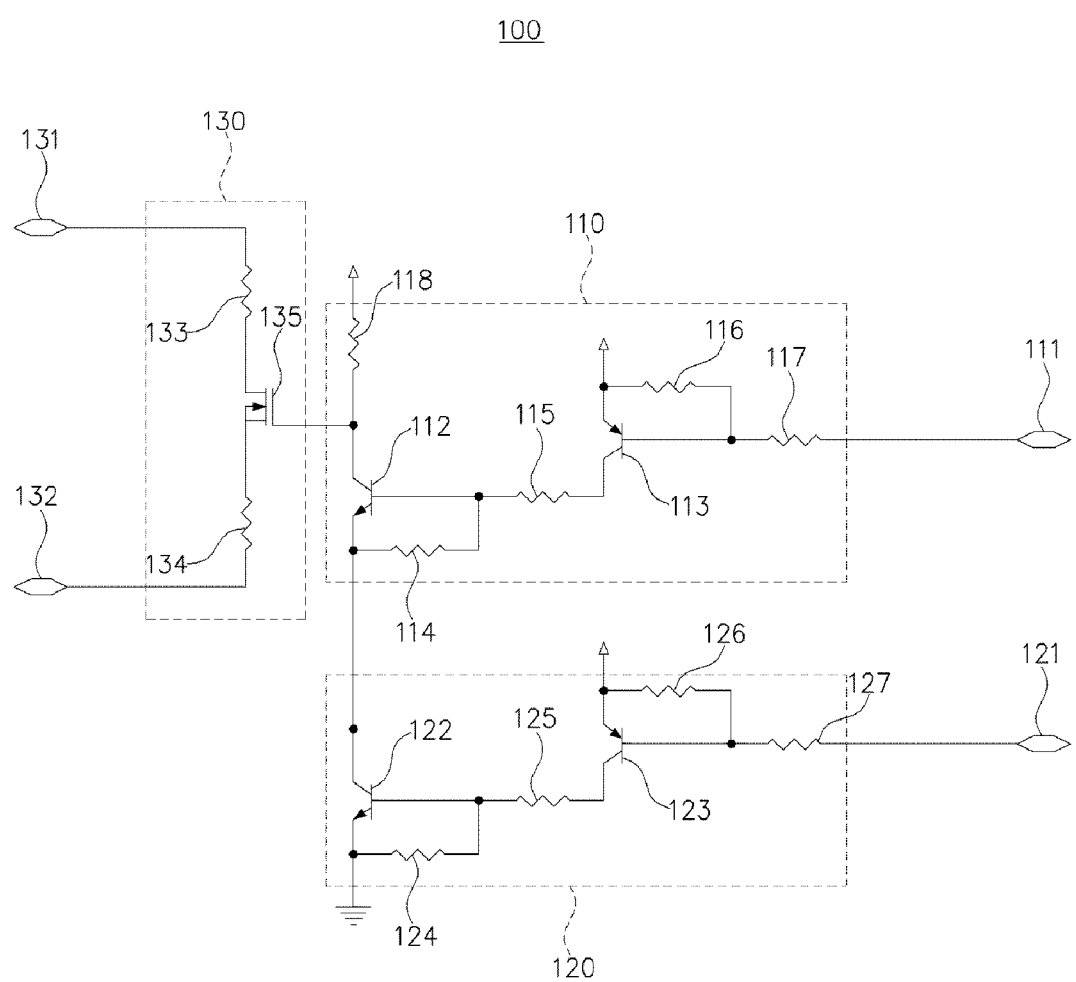
FIG. 5 is a diagram illustrating an example of a detailed configuration of the terminating resistance generation device for differential input mode communication according to the exemplary embodiment of the present invention.

FIG. 5 is a diagram illustrating an example of a detailed configuration of the terminating resistance generation device for differential input mode communication according to the exemplary embodiment of the present invention.

Referring to FIG. 5, the first circuit unit 110 may include one or more transistors 112 and 113 that are turned on to operate only when the first ground terminal 111 is connected to the ground. In FIG. 5, the first circuit unit 110 includes two transistors 112 and 113, but this is according to the exemplary embodiment and as necessary, the number of transistors may be one or three or more.

The first circuit unit 110 may include voltage dividing resistances 114, 115, 116, and 117 for distributing voltage applied to the transistors 112 and 113. Further, the first circuit unit 110 may include a load resistance 118 for applying voltage when the first circuit unit 110 and the second circuit 120 operate, and as a result, current flows.

The second circuit unit 120 may include one or more transistors 122 and 123 that are turned on to operate only when the second ground terminal 121 is connected to the ground. In FIG. 5, the second circuit unit 120 includes two transistors 122 and 123, but this is according to the exemplary embodiment and as necessary, the number of transistors may be one or three or more.

The second circuit unit 120 may include voltage dividing resistances 124, 125, 126, and 127 for distributing voltage applied to the transistors 122 and 123.

The terminating resistance generating unit 130 may include a plurality of resistances 133 and 134 and a switching element 135 between the plurality of resistances 133 and 134. The terminating resistance generating unit 130 generates terminating resistance when one of the first ground terminal 111 and the second ground terminal 112 is not connected, and as a result, only one of the first circuit unit 110 and the second circuit unit 120 operates through the configuration illustrated in FIG. 5.

For example, the terminating resistance generating unit 130 does not generate the terminating resistance because the switching element 135 is turned off, and as a result, the plurality of resistances 133 and 134 are not connected when both the first circuit unit 110 and the second circuit unit 120 operate. In addition, the terminating resistance generating unit 130 generates the terminating resistance because the switching element 135 is turned on, and as a result, the plurality of resistances 133 and 134 are connected to each other when only one of the first circuit unit 110 and the second circuit unit 120 operates.

In the exemplary embodiment, the switching element 135 may be an N-channel depletion type MOSFET. Since the N-channel depletion type MOSFET has a property that the N-channel depletion type MOSFET is turned off when voltage is applied to a gate and turned on when voltage is not applied to the gate, the N-channel depletion type MOSFET may be used as the switching element 135 of the terminating resistance generating unit 130 of the terminating resistance generation device 100 according to the exemplary embodiment of the present invention.

For example, when both the first ground terminal 111 and the second ground terminal 121 are connected, and as a result, the first circuit unit 110 and the second circuit unit 120 operate, all of the transistors 112, 113, 122, and 123 of the first circuit unit 110 and the second circuit unit 120 operate, and as a result, voltage is applied to the load resistance 118 of the first circuit unit 110 and the N-channel depletion type MOSFET 135 is turned off. Accordingly, the resistances 133 and 134 of the terminating resistance generating unit 130 are not connected to each other, and as a result, the terminating resistance is not generated.

When the first ground terminal 111 is not connected, and as a result, the first circuit unit 110 does not operate but only the second circuit unit 120 operates, the transistors 112 and 113 of the first circuit unit 110 do not operate, and as a result, voltage is not applied to the load resistance 118 of the first circuit unit 110 and the N-channel depletion type MOSFET 135 is turned on. Accordingly, the resistances 133 and 134 of the terminating resistance generating unit 130 are connected to each other, and as a result, the terminating resistance is generated.

Similarly, when the second ground terminal 121 is not connected, and as a result, the second circuit unit 120 does not operate but only the first circuit unit 110 operates, the transistors 122 and 123 of the second circuit unit 120 do not operate, and as a result, voltage is not applied to the load resistance 118 of the first circuit unit 110 and the N-channel depletion type MOSFET 135 is turned on. Accordingly, the resistances 133 and 134 of the terminating resistance generating unit 130 are connected to each other, and as a result, the terminating resistance is generated.

As such, in the terminating resistance generation device 100 according to the exemplary embodiment of the present invention, since whether the terminating resistance is generated is determined depending on whether both the first ground terminal 110 and the second ground terminal 120 are connected to the ground, the terminating resistance generation device 100 needs not manage the communication board so as to distinguish whether the communication board is positioned at the termination even though the same circuit configuration is provided and it is possible to prevent a mistake in which the terminating resistance is removed from the communication board positioned at the termination at the time of installing the communication device.

Hereinafter, an example in which the terminating resistance generation device 100 for differential input mode communication according to the exemplary embodiment of the present invention applied to the differential input mode communication device will be described with reference to FIG. 6.

Figure 6:
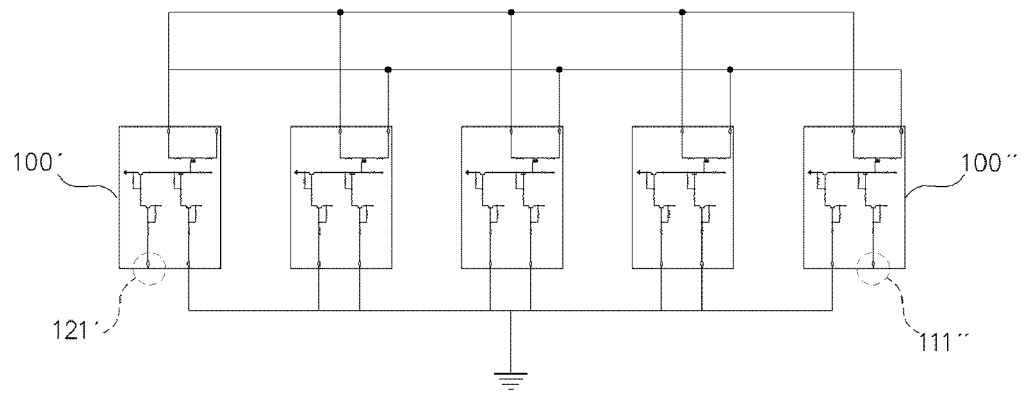
FIG. 6 is a diagram illustrating an example of a detailed configuration of a differential input mode communication device according to an exemplary embodiment of the present invention.

FIG. 6 is a diagram illustrating an example of a detailed configuration of a differential input mode communication device according to an exemplary embodiment of the present invention.

The differential input mode communication device according to the exemplary embodiment of the present invention may use one differential input mode communication among controller area network (CAN) communication, recommended standard (RS)-485 communication, and recommended standard (RS)-422 communication.

The differential input mode communication device according to the exemplary embodiment of the present invention may include a plurality of communication boards that perform the differential input mode communication. In addition, the communication board may include a terminating resistance generation device that generates terminating resistance depending on whether the communication board is positioned at the termination. The terminating resistance generation device may be the terminating resistance generation device 100 described with reference to FIGS. 4 and 5.

In FIG. 6, the terminating resistance generation device 100 for differential input mode communication according to the exemplary embodiment of the present invention is implemented in a form of the communication board of the differential input mode communication device.

Referring to FIG. 6, the terminating resistance is generated at communication boards 100' and 100" positioned at the termination among the communication boards of the differential input mode communication device, since one of the first ground terminal and the second ground terminal is not connected. That is, the terminating resistance is generated at the communication board 100', since the second ground terminal 121' is not connected and the terminating resistance is generated at the communication board 100", since the first ground terminal 111' is not connected.

The terminating resistance is not generated at the communication board which is not positioned at the termination among the communication boards of the differential input mode communication device, since both the first ground terminal and the second ground terminal are connected.

Although specific exemplary embodiments of the present invention has been illustrated and described as above, the technical spirit of the present invention is not limited to the accompanying drawings and the described contents and it is apparent to those skilled in the art that various modifications can be made within the scope without departing from the spirit of the present invention and the modification is included in the appended claims the present invention within the scope not to violate the spirit of the present invention.

What is claimed is:

1. An apparatus for generating terminating resistance for differential input mode communication, comprising:
   a first circuit unit including a first ground terminal and operating only when the first ground terminal is connected to a ground;
   a second circuit unit including a second ground terminal and operating only when the second ground terminal is connected to the ground; and
   a terminating resistance generating unit generating terminating resistance when one of the first ground terminal and the second ground terminal is not connected, and as a result, only one of the first circuit unit and the second circuit unit operates.

2. The apparatus of claim 1, wherein the first circuit unit includes one or more transistors that are turned on to operate only when the first ground terminal is connected to the ground.

3. The apparatus of claim 1, wherein the second circuit unit includes one or more transistors that are turned on to operate only when the second ground terminal is connected to the ground.

4. The apparatus of claim 1, wherein the terminating resistance generating unit includes a plurality of resistances and a switching element among the plurality of resistances.

5. The apparatus of claim 4, wherein the terminating resistance generating unit does not generate the terminating resistance because the switching element is turned off, and as a result, the plurality of resistances are not connected when both the first circuit unit and the second circuit unit operate.

6. The apparatus of claim 4, wherein the terminating resistance generating unit generates the terminating resistance because the switching element is turned on, and as a result, the plurality of resistances are connected to each other when only one of the first circuit unit and the second circuit unit operates.

7. The apparatus of claim 4, wherein the switching element is an N-channel depletion type MOSFET.

8. A differential input mode communication apparatus, comprising:
   a plurality of communication boards performing differential input mode communication,
   wherein the communication board includes a terminating resistance generating apparatus that generates terminating resistance depending on whether the communication board is positioned at a termination, and
   the terminating resistance generating apparatus includes:
   a first circuit unit including a first ground terminal and operating only when the first ground terminal is connected to a ground;
   a second circuit unit including a second ground terminal and operating only when the second ground terminal is connected to the ground; and
   a terminating resistance generating unit generating terminating resistance when one of the first ground terminal and the second ground terminal is not connected, and as a result, only one of the first circuit unit and the second circuit unit operates.

9. The apparatus of claim 8, wherein the terminating resistance is generated at a communication board positioned at the termination among the plurality of communication boards, since one of the first ground terminal and the second ground terminal is not connected, and the terminating resistance is not generated at a communication board not positioned at the termination among the plurality of communication boards, since both the first ground terminal and the second ground terminal are connected.

10. The apparatus of claim 8, wherein the first circuit unit includes one or more transistors that are turned on to operate only when the first ground terminal is connected to the ground.

11. The apparatus of claim 8, wherein the second circuit unit includes one or more transistors that are turned on to operate only when the second ground terminal is connected to the ground.

12. The apparatus of claim 8, wherein the terminating resistance generating unit includes a plurality of resistances and a switching element among the plurality of resistances.

13. The apparatus of claim 12, wherein the terminating resistance generating unit does not generate the terminating resistance because the switching element is turned off, and as a result, the plurality of resistances are not connected when both the first circuit unit and the second circuit unit operate.

14. The apparatus of claim 12, wherein the terminating resistance generating unit generates the terminating resistance because the switching element is turned on, and as a result, the plurality of resistances are connected to each other when only one of the first circuit unit and the second circuit unit operates.

15. The apparatus of claim 12, wherein the switching element is an N-channel depletion type MOSFET.

16. The apparatus of claim 8, wherein the differential input mode communication is one of controller area network (CAN) communication, recommended standard (RS)-485 communication, and recommended standard (RS)-422 communication.

\* \* \* \* \*